(12) United States Patent
Shih et al.

(10) Patent No.: US 9,099,538 B2
(45) Date of Patent: Aug. 4, 2015

(54) CONDUCTOR WITH A PLURALITY OF VERTICAL EXTENSIONS FOR A 3D DEVICE

(71) Applicant: MACRONIX INTERNATIONAL CO., LTD., Hsinchu (TW)

(72) Inventors: Yen-Hao Shih, Elmsford, NY (US); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 46 days.

(21) Appl. No.: 14/029,305

(22) Filed: Sep. 17, 2013

(65) Prior Publication Data

US 2015/0076668 A1  Mar. 19, 2015

(51) Int. Cl.
*H01L 21/3205* (2006.01)
*H01L 21/768* (2006.01)
*H01L 23/48* (2006.01)

(52) U.S. Cl.
CPC .... *H01L 21/76883* (2013.01); *H01L 21/76895* (2013.01); *H01L 23/481* (2013.01); *H01L 2224/16145* (2013.01)

(58) Field of Classification Search
CPC .............. H01L 29/66954; H01L 21/32139; H01L 21/823406; H01L 21/76897; H01L 21/823824
USPC .......................................................... 438/587
See application file for complete search history.

(56) References Cited

U.S. PATENT DOCUMENTS

| | | |
|---|---|---|
| 4,630,086 A | 12/1986 | Sato et al. |
| 5,286,994 A | 2/1994 | Ozawa et al. |
| 5,319,229 A | 6/1994 | Shimoji et al. |
| 5,851,881 A | 12/1998 | Lin et al. |
| 5,952,692 A | 9/1999 | Nakazato et al. |
| 6,011,725 A | 1/2000 | Eitan |
| 6,026,026 A | 2/2000 | Chan et al. |
| 6,034,882 A | 3/2000 | Johnson et al. |
| 6,074,917 A | 6/2000 | Chang et al. |

(Continued)

FOREIGN PATENT DOCUMENTS

| | | |
|---|---|---|
| EP | 0016246 A1 | 10/1980 |
| EP | 1411555 A2 | 4/2004 |

(Continued)

OTHER PUBLICATIONS

"Magnetic Bit Boost," www.sciencenews.org, Dec. 18 & 25, 2004, p. 389, vol. 166.

(Continued)

*Primary Examiner* — Quoc Hoang
(74) *Attorney, Agent, or Firm* — Haynes Beffel & Wolfeld LLP

(57) ABSTRACT

Conductors in a 3D circuit that include horizontal lines with a plurality of vertical extensions in high aspect ratio trenches can be formed using a two-step etching procedure. The procedure can comprise providing a substrate having a plurality of spaced-apart stacks; forming a pattern of vertical pillars in a body of conductor material between stacks; and forming a pattern of horizontal lines in the body of conductor material over stacks, the horizontal lines connecting vertical pillars in the pattern of vertical pillars. The body of conductor material can be deposited over the plurality of spaced-apart stacks. A first etch process can be used to form the pattern of vertical pillars. A second etch process can be used to form the pattern of horizontal lines. The conductors can be used as word lines or as bit lines in 3D memory.

15 Claims, 13 Drawing Sheets

(56) References Cited

U.S. PATENT DOCUMENTS

| | | | |
|---|---|---|---|
| 6,133,603 A | 10/2000 | Nomoto | |
| 6,169,693 B1 | 1/2001 | Chan et al. | |
| 6,218,700 B1 | 4/2001 | Papadas | |
| 6,287,915 B1 | 9/2001 | Muramatsu | |
| 6,333,214 B1 | 12/2001 | Kim et al. | |
| 6,512,696 B1 | 1/2003 | Fan et al. | |
| 6,531,359 B1 | 3/2003 | Tempel et al. | |
| 6,605,840 B1 | 8/2003 | Wu | |
| 6,657,253 B2 | 12/2003 | Kim et al. | |
| 6,709,928 B1 | 3/2004 | Jenne et al. | |
| 6,713,315 B2 | 3/2004 | Kuo et al. | |
| 6,720,630 B2 | 4/2004 | Mandelman et al. | |
| 6,784,480 B2 | 8/2004 | Bhattacharyya | |
| 6,818,558 B1 | 11/2004 | Rathor et al. | |
| 6,897,533 B1 | 5/2005 | Yang et al. | |
| 6,906,361 B2 | 6/2005 | Zhang | |
| 6,906,940 B1 | 6/2005 | Lue | |
| 6,912,163 B2 | 6/2005 | Zheng et al. | |
| 6,977,201 B2 | 12/2005 | Jung | |
| 7,005,350 B2 | 2/2006 | Walker et al. | |
| 7,075,828 B2 | 7/2006 | Lue et al. | |
| 7,081,377 B2 | 7/2006 | Cleeves | |
| 7,115,469 B1 | 10/2006 | Halliyal et al. | |
| 7,115,942 B2 | 10/2006 | Wang | |
| 7,129,538 B2 | 10/2006 | Lee et al. | |
| 7,133,313 B2 | 11/2006 | Shih | |
| 7,151,692 B2 | 12/2006 | Wu | |
| 7,164,603 B2 | 1/2007 | Shih et al. | |
| 7,177,169 B2 | 2/2007 | Scheuerlein | |
| 7,187,590 B2 | 3/2007 | Zous et al. | |
| 7,190,614 B2 | 3/2007 | Wu | |
| 7,209,390 B2 | 4/2007 | Lue et al. | |
| 7,236,394 B2 | 6/2007 | Chen et al. | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,569,468 B2 | 8/2009 | Chen et al. | |
| 7,851,849 B2 | 12/2010 | Kiyotoshi | |
| 8,199,576 B2 | 6/2012 | Fasoli et al. | |
| 8,363,476 B2 | 1/2013 | Lue et al. | |
| 8,482,055 B2* | 7/2013 | Choi et al. | 257/324 |
| 8,488,387 B2 | 7/2013 | Lue et al. | |
| 8,503,213 B2 | 8/2013 | Chen et al. | |
| 8,513,725 B2* | 8/2013 | Sakuma et al. | 257/314 |
| 8,605,495 B2 | 12/2013 | Lung | |
| 2003/0025147 A1 | 2/2003 | Nomoto et al. | |
| 2003/0030100 A1 | 2/2003 | Lee et al. | |
| 2003/0032242 A1 | 2/2003 | Lee et al. | |
| 2003/0042534 A1 | 3/2003 | Bhattacharyya | |
| 2003/0047755 A1 | 3/2003 | Lee et al. | |
| 2003/0146465 A1 | 8/2003 | Wu | |
| 2003/0224564 A1 | 12/2003 | Kang et al. | |
| 2004/0079983 A1 | 4/2004 | Chae et al. | |
| 2004/0102002 A1 | 5/2004 | Sandhu et al. | |
| 2004/0183126 A1 | 9/2004 | Bae et al. | |
| 2004/0238974 A1 | 12/2004 | Baik | |
| 2004/0256679 A1 | 12/2004 | Hu | |
| 2005/0006696 A1 | 1/2005 | Noguchi et al. | |
| 2005/0023603 A1 | 2/2005 | Eldridge et al. | |
| 2005/0074937 A1 | 4/2005 | Jung | |
| 2005/0093054 A1 | 5/2005 | Jung | |
| 2005/0219906 A1 | 10/2005 | Wu | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0270849 A1 | 12/2005 | Lue | |
| 2005/0280061 A1 | 12/2005 | Lee | |
| 2005/0281085 A1 | 12/2005 | Wu | |
| 2006/0088983 A1 | 4/2006 | Fujisawa et al. | |
| 2006/0097341 A1 | 5/2006 | Pellizzer et al. | |
| 2006/0124991 A1 | 6/2006 | Ohba | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202261 A1 | 9/2006 | Lue et al. | |
| 2006/0258090 A1 | 11/2006 | Bhattacharyya et al. | |
| 2006/0261401 A1 | 11/2006 | Bhattacharyya | |
| 2006/0281260 A1 | 12/2006 | Lue | |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0045718 A1 | 3/2007 | Bhattacharyya | |
| 2007/0069283 A1 | 3/2007 | Shih et al. | |
| 2007/0140001 A1 | 6/2007 | Motoi et al. | |
| 2007/0253233 A1 | 11/2007 | Mueller et al. | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0106931 A1 | 5/2008 | Toda | |
| 2008/0175032 A1 | 7/2008 | Tanaka et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0097321 A1 | 4/2009 | Kim et al. | |
| 2009/0166723 A1 | 7/2009 | Sung et al. | |
| 2009/0184360 A1 | 7/2009 | Jin et al. | |
| 2010/0226195 A1 | 9/2010 | Lue | |
| 2010/0270593 A1 | 10/2010 | Lung et al. | |
| 2011/0095353 A1 | 4/2011 | Lue | |
| 2011/0149656 A1 | 6/2011 | Tang et al. | |
| 2012/0007167 A1 | 1/2012 | Hung et al. | |
| 2012/0051137 A1 | 3/2012 | Hung et al. | |
| 2012/0068241 A1 | 3/2012 | Sakuma et al. | |
| 2012/0146126 A1 | 6/2012 | Lai et al. | |
| 2012/0168849 A1 | 7/2012 | Choi et al. | |
| 2012/0181580 A1 | 7/2012 | Lue et al. | |
| 2012/0181599 A1 | 7/2012 | Lung | |
| 2012/0181654 A1 | 7/2012 | Lue | |
| 2012/0181684 A1 | 7/2012 | Lue et al. | |
| 2012/0182801 A1 | 7/2012 | Lue | |
| 2012/0182802 A1 | 7/2012 | Hung et al. | |
| 2012/0182806 A1 | 7/2012 | Chen et al. | |
| 2012/0182807 A1 | 7/2012 | Lue | |
| 2012/0182808 A1 | 7/2012 | Lue et al. | |
| 2012/0235224 A1 | 9/2012 | Yeh | |
| 2012/0236642 A1 | 9/2012 | Lue | |
| 2012/0281478 A1 | 11/2012 | Lue et al. | |
| 2012/0287706 A1 | 11/2012 | Lung | |
| 2012/0327714 A1 | 12/2012 | Lue | |
| 2012/0327719 A1 | 12/2012 | Lue | |
| 2013/0003434 A1 | 1/2013 | Lue et al. | |
| 2013/0175598 A1 | 7/2013 | Chen et al. | |
| 2013/0182487 A1 | 7/2013 | Lee et al. | |
| 2013/0277799 A1 | 10/2013 | Chen et al. | |
| 2013/0334575 A1 | 12/2013 | Chen et al. | |

FOREIGN PATENT DOCUMENTS

| | | |
|---|---|---|
| EP | 1936681 A1 | 6/2008 |
| EP | 2048709 A2 | 4/2009 |
| JP | 11040682 A | 2/1999 |
| JP | 2003068893 A | 3/2003 |
| JP | 2004363329 A | 12/2004 |
| JP | 2005184029 | 7/2005 |
| JP | 2005197624 A | 7/2005 |
| KR | 20010056888 A | 7/2001 |
| KR | 20050011203 A | 1/2005 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

(56) References Cited

OTHER PUBLICATIONS

Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, Sep. 21-23, 2004, 4 PP.
Blake thesis, "Investigation of GeTeSb5 Chalcogenide Films for Use as an Analog Memory," AFIT/GE/ENG/00M-04, Mar. 2000, 121 pages.
Blomme et al., "Multilayer tunneling barriers for nonvolatile memory applications," Device Research Conf, 2002 60th DRC Digest 153-154.
Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.
Buckley, J., et al., "Engineering of 'Conduction Band-Crested Barriers' or 'Dielectric Constant-Crested Barriers' in view of their application of floating-gate non-volatile memory devices," VLSI 2004, 55-56.
Chang L.-P. et al., "An Adaptive Striping Architecture for Flash Memory Storage Systems of Embedded Systems," Proc. of the IEEE RTAS, pp. 187-196, 2002.
Chang Y.-H. et al., "Endurance Enhancement of Flash-Memory Storage Systems: An Efficient Static Wear Leveling Design," Proc. of the IEEE/ACM DAC, pp. 212-217, 2007.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen C-H et al., "Age-Based PCM Wear Leveling with Nearly Zero Search Cost," 49th ACM/EDAC/IEEE Design Automation Conference (DAC), San Francisco, Jun. 2012, pp. 453-458.
Chen, AN et al., "Non-Volatile Resistive Switching for Advanced Memory Applications," IEEE IEDM, Dec. 5-7, 2005, 4 pp.
Chen, Y-C. et al., "An Access-Transistor-Free (0T/1R) Non-Volatile Resistance Random Access Memory (RRAM) Using a Novel Threshold Switching, Self-Rectifying Chalcogenide Device," IEDM 2003, pp. 37.4.1-37.4.4.
Chindalore, et al., "A New Combination-Erase Technique for Erasing Nitride Based (SONOS) Nonvolatile Memories," IEEE Electron Dev. Lett 24(4) Apr. 2003, 257-259.
Cho S. et al., "Flip-N-Write: A Simple Deterministic Technique to Improve PRAM Write Performance, Energy and Endurance," Proc. of the IEEE/ACM MICRO, pp. 347-357, 2009.
Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.
Condit J. et al., "Better I/O Through Byte-Addressable, Persistent Memory," Proc. of the ACM SIGOPS 22nd Symp. On Operating Systems Principles (SOSP '09) Oct. 2009, Big Sky, Montata, 14pp.
DiMaria, D.J., et al., "Conduction Studies in Silicon Nitride: Dark Currents and Photocurrents," IBM J. Res. Dev. May 1977, 227-244.
Eitan, et al., "NROM: A Novel Localized Trapping, 2-Bit Nonvolatile Memory Cell," IEEE Electron Device Lett 21(11) Nov. 2000, 543-545.
European Partial Search Report from Application No. EP 12166199.5 mailed Oct. 26, 2012, 6 pages.
European search report dated Jun. 10, 2013 for related application EP 13154198, 6 pp.
European Search Report from EP07252779 mailed Nov. 5, 2009, 7 pages.
Extended EP Search Report in Application No. EP12163608.8, mailed Sep. 20, 2012, 8 pages.
Ferreira A.P. et al., "Increasing PCM Main Memory Lifetime," Proc. of the Conference on Design, Automation and Test in Europe (DATE '10) Dresden, Mar. 2010, pp. 914-919.
Ferreira A.P. et al., "Using PCM in Next-generation Embedded Space Applications," Proc. of the IEEE RTAS, pp. 153-162, 2010.
Fukuzumi et al. "Optimal Integration and Characteristics of Vertical Array Devices for Ultra-High Density, Bit-Cost Scalable Flash Memory," IEEE Dec. 2007, pp. 449-452.
Gal E. et al., "Algorithms and Data Structures for Flash Memories," ACM Computing Surveys, 37(2):138-163, 2005.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Goebel, B., et al., "Fully Depleted Surrounding Gate Transistor (SGT) for 70 nm DRAM and Beyond," IEEE IEDM 2002, 10.8.1-10.8.4.
Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.
Govoreanu et al., "Simulation of Nanofloating Gate Memory with High-k Stacked Dielectrics," IEEE SISPAD Intl. Conf. Sep. 3-5, 2003 299-302.
Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.
Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

(56) References Cited

OTHER PUBLICATIONS

Hu J. et al., "Reducing Write Activities on Non-volatile Memories in Embedded CMPs via Data Migration and Recomputation," Proc. of the IEEE/ACM DAC, pp. 350-355, 2010.
Huai, Yiming, "Spin-Transfer Torque MRAM (STT-MRAM): Challenges and Prospects," AAPPS Bulletin, vol. 18, No. 6, Dec. 2008, pp. 33-40.
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Ito, et al., "A Novel MNOS Technology Using Gate Hole Injection in Erase Operation for Embedded Nonvolatile Memory Applications." 2004 Symp. on VLSI Tech Dig. of Papers 2004, 80-81.
Iwasaki, Hiroko et al., "Completely Erasable Phase Change Optical Disk," Jpn. J. Appl. Phys., Feb. 1992, pp. 461-465, vol. 31.
Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Jeong, Min-Kyu, et al., "Gate Work Function and Contact Engineering in Nanoscale Vertical Pillar Transistor for DRAM Cell Transistors," Kyoto, Japan, Nov. 5-8, 2007, pp. 112-113.
Jiang L. et al., "Cooperative Integration of Wear-Leveling and Salvaging for PCM Main Memory," Proc. of the IEEE/IFIP DSN, pp. 221-232, 2011.
Jiang L. et al., "LLS: Cooperative Integration of Wear-Leveling and Salvaging for PCM Main Memory," Proc. of the IEEE/IFIP DSN, pp. 221-232, 2011.
Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.
Jung et al., "Three Dimensionally Stacked Nand Flash Memory Technology Using Stacking Single Crystal Si Layers on ILD and TANOS Structure for Beyond 30nm Node," IEEE IEDM 2006, Dec. 11-13, 4 pages.
Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.
Kau DC, et al., "A stackable cross point phase change memory," 2009 International Electron Devices Meeting, Baltimore MD, pp. 27.1.1-27.1.4.
Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.
Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Kinam et al., "Reliability Investigations for Manufacturable High Density PRAM," IEEE 43rd Annual International Reliability Physics Symposium, San Jose, Apr. 17-21, 2005, pp. 157-162.
Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.
Kinoshita, A, et al., "High-Performance 50-nm-Gate-Length Schottky-Source/Drain MOSFETs with Dopant-Segregation Junctions," IEEE Symp. on VLSI Technology Digest of Papers, Jun. 14-16, 2005, pp. 158-159.
Kinoshita, A, et al., "Solution for High-Performance Schottky-Source/Drain MOSFETs: Schottky Barrier Height Engineering with Dopant Segregation Technique," IEEE Symp. on VLSI Technology Digest of Papers, Jun. 15-17, 2004, pp. 168-169.
Kojima, Rie et al., "Ge—Sn—Sb—Te Phase-change Recording Material Having High Crystallization Speed," Proceedings of PCOS 2000, pp. 36-41.
Lacaita, A. L., et al., "Electrothermal and Phase-change Dynamics in Chalcogenide-based Memories," IEEE IEDM Dec. 13-15, 2004, 4 pp.
Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.
Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.
Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.
Lai, Stefan, "Current Status of the Phase Change Memory and Its Future," IEEE IEDM Dec. 10, 2003, pp. 255-258.
Lai, Stephan et al., "OUM-A 180 nm Nonvolatile Memory Cell Element Technology for Stand Alone and Embedded Applications," IEEE IEDM Dec. 2-5, 2001, pp. 803-806.
Lee B.C. et al., Architecting Phase Change Memory as a Scalable DRAM Alternative, Proc. 36th Annual Int'l Symp. on Computer Architecture (ISCA '09), Austin, TX, Jun. 2009, pp. 2-13.
Lee J-D et al., "Effects of Interface Trap Generation and Annihilation on the Data Retention Characteristics of Flash Memory Cells," IEEE Trans. on Device and Materials Reliability, vol. 4, No. 1, Mar. 2004, pp. 110-117.
Lee, Chang, et al., "A Novel SONOS Structure of SiO2/SiN/Al2O3 with TaN Metal Gate for Multi-Giga Bit Flash Memeries," IEEE 2003, 4 pages.
Li F., et al., "Evaluation of SiO2 Antifuse ina 3D-OTP Memory," IEEE Transaction on Device and Materials Reliability, vol. 4, No. 3, 2004, pp. 416-421.
Likharev, "Layered Tunnel Barriers for Nonvolatile Memory Devices," Appl. Phys. Lett. 73(15) Oct. 1998 2137-2139.
Lue et al., "A BE-SONOS (Bandgap Engineered SONOS) NAND for Post-Floating Gate Era Flash Memory," Int'l Symp on VLSI Tech, Apr. 23-25, 2007, 2 pages.
Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.
Lue et al., "A Novel P-Channel NAND-Type Flash memory with 2-bit/cell Operation and High Programming Throughput (>20 MB/sec)," IEEE 2005, 4 pages.
Lue et al., "BE-SONOS: A Bandgap Engineered SONOS with Excellent Performance and Reliability," IEDM Tech. Digest Dec. 2005 547-550.
Lue, Hang-Ting et al., Scaling Evaluation of BE-SONOS NAND Flash Beyond 20 nm, 2008 Symposium on VLSI technology, Digest of Papers, Jun. 2008, 116-117.
Maeda, S, et al. "A Vertical F-Shape Transistor (VFT) Cell for 1Gbit DRAM and Beyond," 1994 Symposium on VLSI Technology, Digest of Technical Papers. Jun. 7-9, 1994 pp. 133-134.

(56) References Cited

OTHER PUBLICATIONS

Maikap, S., et al., "High-k HfO2/TiO2/HfO2 multilayer quantum well flash memory devices," Intl Symp on VLSI Technology, Sytems and Applications Apr. 23-25, 2007, pp. 1-2.
Mielke N et al., "Flash EEPROM Threshold Instabilities due to Charge Trapping During Program/Erase Cycling," IEEE Trans. on Device and Materials Reliability, vol. 4, No. 3, Sep. 2004, pp. 335-344.
Minami, et al., "New Scaling Guidelines for MNOS Nonvolatile Memory Devices," IEEE Trans on Electron Devices 38(11) Nov. 1991 2519-2526.
Mott, Nevill, "Electrons in Glass," Nobel Lecture, Dec. 8, 1977, Physics, 1977, pp. 403-413.
Office Action mailed Oct. 19, 2007 in U.S. Appl. No. 11/324,495.
Office Action mailed Nov. 23, 2007 in U.S. Appl. No. 11/197,668.
Oh, Hyung-Rok, et al., "Enhanced Write Performance of a 64Mb Phase-Change Random Access Memory," ISSCC 2005, Session 2, Non-Volatile Memory, 2.3, 3 pages.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.
Paul et al., "Impact of a Process Variation on Nanowire and Nanotube Device Performance," IEEE Trans. on Electron Devices, vol. 54, No. 9, Sep. 2007, pp. 2369-2376.
Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.
Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Qureshi M. et al., "Practical and Secure PCM Systems by Online Detection of Malicious Write Streams," Proc. of the IEEE HPCA, pp. 478-489, 2011.
Qureshi M.K. et al. "Improving Read Performance of Phase Change Memories via Write Cancellation and Write Pausing," IEEE 16th Int'l Symp. High Performance Computer Architecture (HPCA), Bangalore, Jan. 2010, pp. 1-11.
Qureshi M.K. et al., "Enhancing Lifetime and Security of PCM-Based Main Memory with Start-Gap Wear Leveling," Proc. 42nd Annual IEEE/ACM Int'l Symp. on Microarchitecture (MICRO '09) New York, NY, Dec. 2009, pp. 14-23.
Qureshi M.K. et al., "Scalable High Performance Main Memory System Using Phase-Change Memory Technology," Proc. 36th Annual Int'l Symp. on Computer Architecture (ISCA '09), Jun. 2009, Austin, TX, pp. 24-33.
Radaelli, A. et al., "Electronic Switching Effect and Phase-Change Transition in Chalcogenide Materials," IEEE Electron Device Letters, Oct. 2004, pp. 684-686, vol. 25, No. 10.
Risch, Lothar, et al., "Recent Progress with Vertical Transistors," Solid-State Device Research Conference, 1997. Proceeding of the 27th European Sep. 22-24, 1997 pp. 34-41.
Rochefort, C. et al., "Manufacturing of High Aspect-Ration p-n Junctions Using Vapor Phase Doping for Application in Multi-Resurf Devices," IEEE Jun. 4-7, 2002, pp. 237-240.
Sasago Y., et al., "Cross-point phase change memory with 4F2 cell size driven by low-contact-resistivity poly-Si diode," 2009 Symposium on VLSI Technology Digest of Tech. Papers, pp. 24-25.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.
Schechter S. et al., "Use ECP, not ECC, for Hard Failures in Resistive Memories," Proc. 37th Annual Int'l Symp. on Computer Architecture (ISCA '10) Saint-Malo, France, Jun. 2010, 12 pp.
Seong N.H. et al., "Security Refresh: Prevent Malicious Wear-Out and Increase Durability for Phase-Change Memory with Dynamically Randomized Address Mapping," Proc. of the IEEE/ACM ISCA, pp. 383-394, 2010.
Shih et al., "A Novel 2-bit/cell Nitride Storage Flash Memory with Greater than 1M P/E-cycle Endurance," IEEE IEDM 2004 881-884 (36.3.1-36.3.4).
Shin et al., A Novel NAND-type MONOS Memory using 63 nm Process Technology for a Multi-Gigabit Flash EEPROMs, IEEE IEDM Technical Digest Dec. 5, 2005, pp. 327-330.
Shin et al., High Reliable SONOS-type NAND Flash Memory Cell with Al2O3 or Top Oxide, IEEE IEDM, Feb. 16-20, 2003 (MANOS).
Sim et al., "Fully 3-Dimensional NOR Flash Cell with Recessed Channel and Cylindrical Floating Gate—A Scaling Direction for 65nm and Beyond," 2006 Symposium on VLSI Technology Digest of Technical Papers, 2006 IEEE, pp. 1-2.
Smullen C.W. et al., "Accelerating Enterprise Sollid-State Disks with Non-Volatile Merge Caching," Proc. Int'l Conf. on Green Computing (GREENCOMP '10) Chicago, IL, Aug. 2010, pp. 203-214.
Strauss, Karl F. et al., "Overview of Radiation Tolerant Unlimited Write Cycle Non-Volatile Memory," IEEE Mar. 18-25, 2000, pp. 399-408.
Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.
Sung et al., "Multi-Layer SONOS with Direct Tunnel Oxide for High Speed and Long Retention Time," IEEE Silicon Nanoelectronics Workshop Jun. 2002 83-84.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
Tsai et al., "Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.
U.S. Appl. No. 13/897,702 entitled Damascene Word Line, filed Jun. 19, 2012, 56 pages.
U.S. Appl. No. 13/935,375, filed Jul. 3, 2013, entitled Damascene Conductor for a 3D Device, 32 pages.
U.S. Appl. No. 13/827,475, filed Mar. 14, 2013 "Programmng Technique for Reducing Program Disturb in Stacked Memory Structures," 47 pages.
Walker et al., "3D TFT-SONOS Memory Cell for Ultra-High Density File Storage Applications," 2003 Symposium on VLSI Tech Digest of Technical Papers, 29-30.
Wang H-H et al., "A New Read-Distrub Failure Mechanism Caused by Boosting Hot-Carrier Injection Effect in MLC NAND Flash Memory," IEEE Int'l Memory Workshop, 2009, pp. 1-2.
Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.
White et al., "On the Go with SONOS" IEEE Circuits and Devices, Jul. 2000, 22-31.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.
Wicker, Guy, "A Comprehensive Model of Submicron Chalcogenide Switching Devices," Doctoral Dissertation, Wayne State University, Detroit, MI 1996, 137 pp.
Wolf, Stanley, Excerpt from: Silicon Processing for the VLSI Era—vol. 4, pp. 674-679, 2004.
Wu Q et al., "A First Study on Self-Healing Solid-State Drives," IEEE Int'l Memory Workshop (IMW), May 2011, 4pp.

(56) References Cited

OTHER PUBLICATIONS

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Wuttig, Matthias, "Towards a Universal Memory?" Nature Materials, Apr. 2005, pp. 265-266, vol. 4.

Xie P. et al., "Analysis of Higher-Order Pitch Division for Sub-32nm Lithography," Optical Microlithography XXII, Proc. SPIE vol. 7274, Mar. 2009, 8 pp.

Yamada et al., "A self-convergence erasing scheme for a simple stacked gate flash EEPROM," Proc. Int'l. Electron Devices Meeting, Dec. 1991 307-310.

Yamada, Noboru, "Potential of Ge—Sb—Te phase-change optical disks for high-data-rate recording in the near future," (Conference Proceedings Paper), Jul. 30, 1997, vol. 3109, 10 pages.

Yeh, C.C., et al., "PHINES: A Novel Low Power Program/Erase, Small Pitch, 2-Bit per Cell Flash Memory," IEDM Tech Digest 2002, 931-934.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Yoon D.H. et al. "FREE-p: Protecting Non-volatile Memory against both Hard and Soft Errors," Proc. of the IEEE HPCA, pp. 466-477, 2011.

Yun et al, "Stacked-nanowire device with virtual source/drain (SD-VSD) for 3D NAND flash memory application," Solid-State Electronics, vol. 64, pp. 42-46 (Jul. 26, 2011).

Yun et al., "Single-Crystalline Si STacked ARray (STAR)," IEEE Trans. Electron. Devices, vol. 58, pp. 1006-1014 (Apr. 2011).

Zhang W. et al., "Exploring Phase Change Memory and 3D Die-Stacking for Power/Thermal Friendly, Fast and Durable Memory Architectures," Proc. of the IEEE PACT, pp. 101-112, 2009.

Zhou P. et al., "A durable and Energy Efficient Main Memory Using Phase Change Memory Technology," Proc. 36th Annual Int'l Symp. on Computer Architecture (ISCA '09), Jun. 2009, Austin, TX, pp. 14-23.

Baik, Seung, et al., "High Speed and Nonvolatile Si Nanocrystal Memory for Scaled Flash Technology using Highly Field-Sensitive Tunnel Barrier," IEEE IEDM 03-545, Dec. 8-10, 2003, pp. 22.3.1-22.3.4.

Lee, Chungho, et al., "Operational and Reliability Comparison of Discrete-Storage Nonvolatile Memories: Advantages of Single-and Double-Layer Metal Nanocrystals," IEEE IEDM 03-557, Dec. 8-10, 2003, pp. 22.6.1-22.6.4.

Takata, M., et al., "New Non-Volatile Memory with Extremely High Density Metal Nano-Dots," IEEE IEDM 03-553, Dec. 8-10, 2003, pp. 22.5.1-22.5.4.

\* cited by examiner

CONDUCTOR WITH A PLURALITY OF VERTICAL EXTENSIONS FOR A 3D DEVICE

BACKGROUND

The present invention relates to high density integrated circuit devices. In particular, embodiments according to the present invention provide a method for manufacturing and a structure for a conductor connected to multiple planes in a three-dimensional high density device.

Three dimensional (3D) memory devices are characterized by multiple layers, each of which can include a planar array of memory cells. Conductors, that connect to multiple planes, such as a high density word line or bit line structure, can present manufacturing difficulties for 3D memory devices.

In some arrangements, a 3D memory device includes a plurality of ridge-shaped stacks, in the form of multiple strips of semiconductor material separated by insulating material. The strips of semiconductor material can include the channels of memory cells in NAND strings, for example. One configuration including these features referred to as a 3D Vertical Gate (3DVG) architecture, is described in U.S. Patent Application Publication No. 2012/0182806 filed 1 Apr. 2011, entitled Memory Architecture Of 3D Array With Alternating Memory String Orientation And String Select Structures, by inventors Shih-Hung Chen and Hang-Ting Lue, which is incorporated by reference as if fully set forth herein.

In a 3DVG architecture, the strips of semiconductor material have side surfaces on the sides of the ridge-shaped stacks. A plurality of conductors configured as word lines, which can be coupled to row decoders, extends orthogonally over the plurality of ridge-shaped stacks. The word lines have surfaces (e.g. bottom surfaces) that conform to the surface of the stacks. This conformal configuration results in a multilayer array of interface regions at cross-points between side surfaces of the semiconductor strips on the stacks and the word lines. Memory elements lie in the interface regions between the side surfaces of the strips and the word lines The memory elements are programmable, like the programmable resistance structures or charge trapping structures in the embodiments described below. The combination of the conformal word line, the memory element and the semiconductor strips within a stack at particular interface regions forms a stack of memory cells. As a result of the array structure, a 3D array of memory cells is provided.

In other embodiments, the active strips can be configured as word lines, with vertical bit lines between the strips for vertical NAND string configurations. See for example, commonly owned U.S. Pat. No. 8,363,476, issued 29 Jan. 2013 (filed 19 Jan. 2011), entitled Memory Device, Manufacturing Method And Operating Method Of The Same, by inventors Hang-Ting Lue and Shi-Hung Chen, which is incorporated by reference as if fully set forth herein.

A number of technologies have been pursued to improve the structure of such conductive lines and the processes for making them, as disclosed in our commonly owned U.S. Patent Application Publication No. 2013/0175598 filed on 10 Jan. 2012, entitled Damascene Word Line, by inventors Shih-Hung Chen, Hang-Ting Lue and Yen-Hao Shih; U.S. patent application Ser. No. 13/527,259, filed on 19 Jun. 2012, entitled Damascene Word Line, by inventors Shih-Hung Chen, Yen-Hao Shih and Hang-Ting Lue; U.S. patent application Ser. No. 13/897,702 filed on 20 May 2013, entitled Damascene Conductor for 3D Array, by inventors Ehr-Kun Lai, Yen-Hao Shih and Guanru Lee; and U.S. patent application Ser. No. 13/935,375 filed on 3 Jul. 2013, entitled Damascene Conductor for a 3D Device, by inventors Chia-Jung Chiu and Guanru Lee, which are incorporated by reference as if fully set forth herein.

The formation of conductive lines that include vertical columns between ridges in high aspect ratio trenches, such as those used word lines in the 3DVG architecture, the vertical NAND architecture and other high density structures, can require complex patterning technologies. For example, one approach can require the use of thick hard masks which can withstand the deep etch required to form the vertical columns in the trenches. The use of thick hard masks can make the etch process difficult because they in effect increase the aspect ratio of the trenches. One problem that can result is that strips of conductive residue can be left between the conductive columns in the trenches, which can short out the adjacent conductors.

It is desirable to provide technologies for use as high-density word lines and bit lines of the type that can be used in complex 3D structures, and in other settings requiring conductors that extend into high aspect ratio trenches.

SUMMARY

For certain three-dimensionally stacked integrated circuit devices, strips of active material, such as bit lines or word lines for memory cells, are stacked in spaced-apart ridge-like structures arranged to extend in a first direction separated by a high aspect ratio trenches. In such structures, conductors, such as word lines or bit lines, can be configured that include vertical pillars defined using a first etch process in the trenches between the spaced-apart ridges, and horizontal lines that connect vertical pillars together, defined using a second etch process, and arranged to be aligned in a second direction, such as perpendicular to the first direction.

A process described herein includes forming the body of conductor material by depositing a conductor material over the plurality of spaced-apart stacks, and then performing a hole type etch and a line type etch in either order, to form the vertical pillars and horizontal lines. Such process includes etching the body of conductor material to form a pattern of vertical holes between the spaced-apart stacks in the body of conductor material; and before or after etching the body of conductor material to form the pattern of vertical holes, etching the body of conductor material to form trenches over the spaced apart stacks, aligned to connect vertical holes the pattern of vertical holes. In this manner, material of the body of conductive material remaining after the hole and line etching comprises the vertical pillars and horizontal lines.

The conductors thus formed can act as bit lines or word lines for a 3D memory. In such 3D memory, memory cells are disposed at the cross-points of the stacked bit lines or word lines and the crossing word lines or bit lines, forming a 3D memory array.

DETAILED DESCRIPTION

Figure 1:
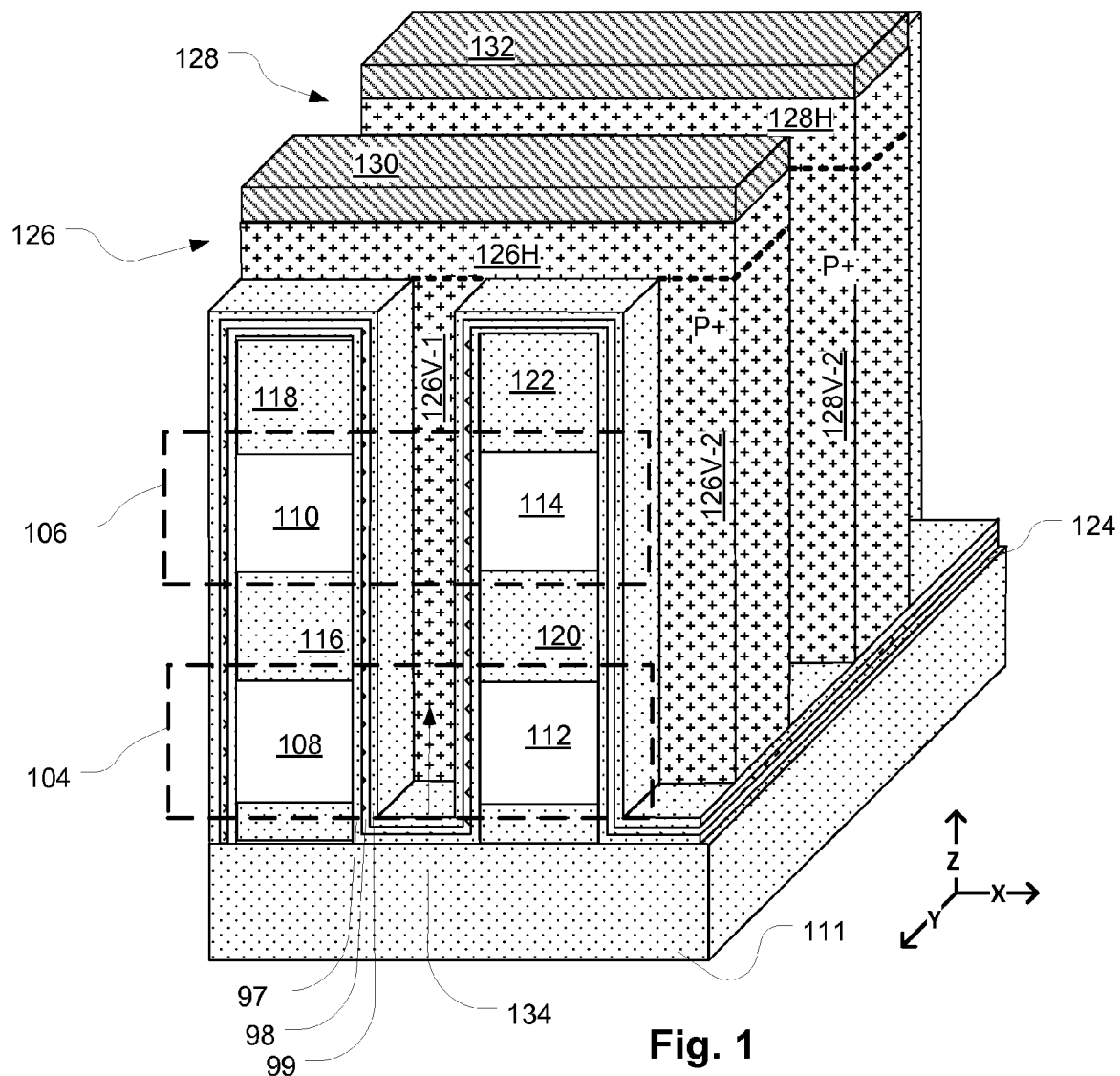
FIG. 1 is a perspective illustration of a 3D memory array including conductor structures.

A detailed description of various embodiments is described with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective view of an example of a 3D memory device including conductors. Various insulating materials are not shown to better illustrate memory stack and conductor structures. As shown, a portion of a 3D memory device overlies a substrate having an insulating layer 111 formed thereon. The substrate can include one or more integrated circuits and other structures. Only two planes, 104 and 106, are shown but the number of planes can be extended to any number of layers N, where N is an integer having a value greater than one. In some examples, the number of planes can be equal to two, four, eight, sixteen, thirty-two or in general for binary decoding of the planes, $2^n$ layers. As shown, the 3D memory device includes stacks of active strips 108, 110, 112, and 114 separated by insulating material 116, 118, 120, and 122. Each of the active strips includes a semiconductor material suitable to act as a channel region in the illustrated embodiment. The stacks are ridge-shaped extending on the Y-axis as illustrated, so that the active strips 108, 110, 112, and 114 can be configured as bodies including channel regions of flash memory cell strings, for example in horizontal NAND string configurations. The configuration of FIG. 1 can be a part of an architecture referred to a 3D Vertical Gate (3DVG), as described in U.S. Patent Application Publication No. 2012/0182806 which is incorporated by reference above.

In other embodiments, the active strips can be configured as word lines for vertical NAND string configurations. See for example, commonly owned U.S. Pat. No. 8,363,476, which is incorporated by reference above.

Active strips 108 and 112 can act as channel regions for memory cell strings in a first memory plane 104. Active strips 110 and 114 can act as channel regions for memory cell strings in second memory plane 106. As illustrated, a layer 124 of memory material coats the plurality of stacks of active strips in this example, and at least on the side walls of the active strips.

In the embodiment of FIG. 1, a plurality of conductors 126, 128 is arranged orthogonally over the plurality of stacks of active strips. The conductors 126, 128 include vertical and horizontal portions as indicated by the dashed lines which can be formed by first (one of hole or line) and second (the complementary one of line or hole) etching processes applied to a single body of conductor material. Thus, the conductors 126, 128 include vertical pillars (e.g., 126V-1, 126V-2) with surfaces conformal with the sidewalls of the plurality of stacks of active strips, within the trenches (e.g. 134) defined by the plurality of stacks. The conductors 126, 128 also include horizontal lines 126H, and define a multilayer array of interface regions at cross-points between side surfaces of the active strips 108, 110, 112, and 114 on the stacks and conductors 126, 128. As shown, a layer of silicide (e.g. tungsten silicide, cobalt silicide, titanium silicide or nickel silicide) 130, 132 can be formed over the top surfaces of conductors 126, 128.

Depending upon the implementation, layer 124 of memory material can comprise multilayer dielectric charge storage structures. For example, a multilayer dielectric charge storage structure includes a tunneling layer 97 comprising a silicon oxide, a charge trapping layer 98 comprising a silicon nitride and a blocking layer 99 comprising a silicon oxide. In some examples known as BE-SONOS, the tunneling layer 97 in the dielectric charge storage layer can comprise a first layer of silicon oxide less than about 2 nanometers thick, a layer of silicon nitride less than about 3 nanometers thick and a second layer of silicon oxide less than about 3 nanometers thick. In other implementations, layer 124 of memory material can comprise only a charge trapping layer without the tunneling layer or the blocking layer.

In the alternative, an anti-fuse material such as a silicon dioxide, silicon oxynitride or other silicon oxides, for example having a thickness on the order of 1 to 5 nanometers, can be utilized. Other anti-fuse materials may be used, such as silicon nitride and transition metal oxides like hafnium oxide. For anti-fuse embodiments, active strips 110 and 114 can be a semiconductor material with a first conductivity type (e.g. p-type). Conductors (for example, word lines) 126, 128 can be a semiconductor material with a second conductivity type (e.g. n-type). For example, the active strips 110 and 114 can be made using p-type polysilicon while the conductors 126, 128 can be made using relatively heavily doped n+-type polysilicon. For anti-fuse embodiments, the width of the active strips should be enough to provide room for a depletion region to support the diode operation. As a result, memory cells comprising a rectifier formed by the p-n junction with a programmable anti-fuse layer in between the anode and cathode are formed in the 3D array of cross-points between the polysilicon strips and conductor lines.

In other embodiments, different programmable resistance memory materials can be used as the memory material, including metal oxides like tungsten oxide on tungsten or doped metal oxide, and others. Various kinds of programmable metallization material can also be implemented as the memory material to form programmable metallization cells (PMC). Some of such materials can form devices that can be programmed and erased at multiple voltages or currents, and can be implemented for operations storing multiple bits per cell.

Figure 2:
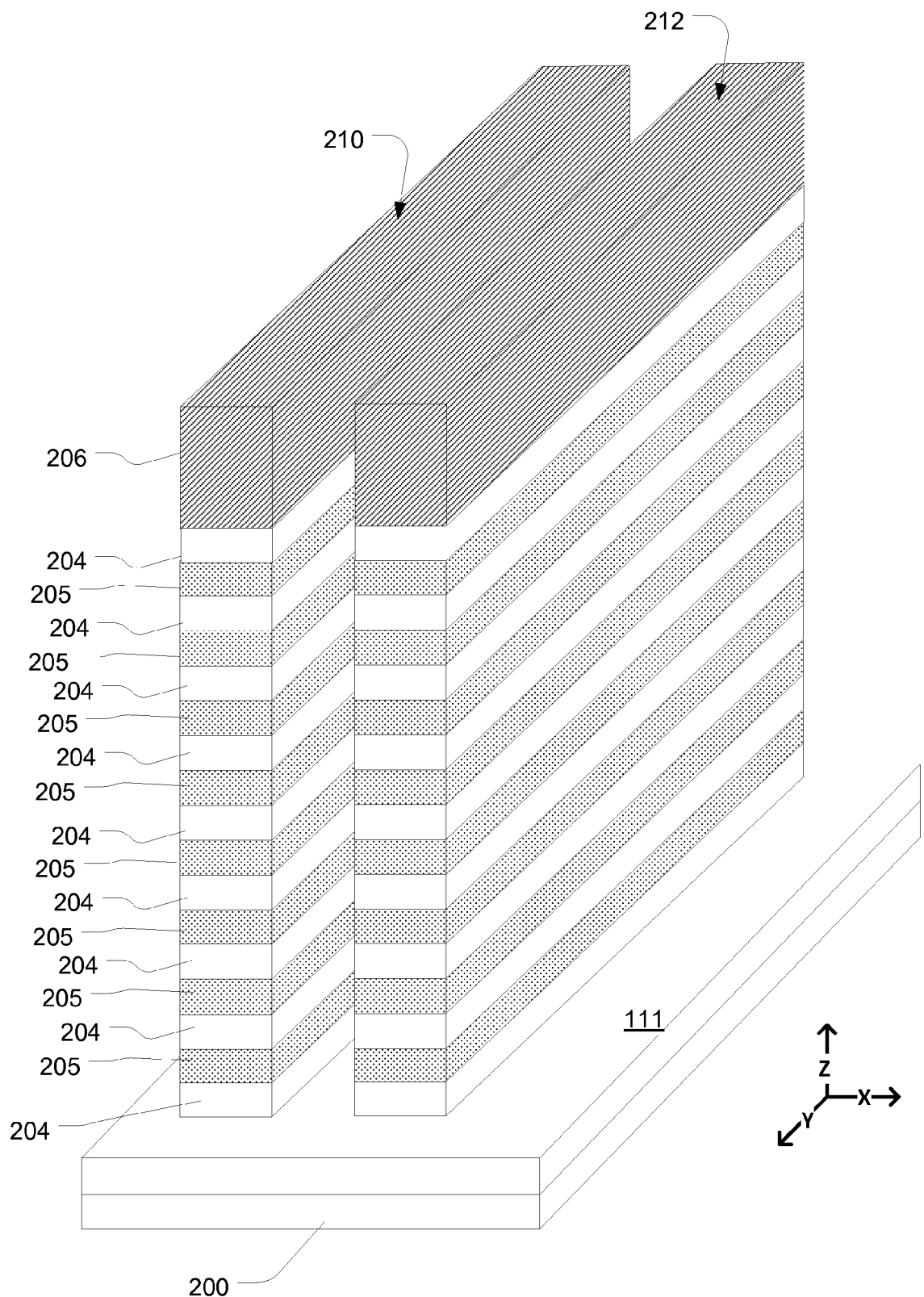
FIGS. 2-5, 6A, 6B, 7, 8, 9A, 9B, 10 and 11 illustrate stages in a method for forming conductor structures for a 3D memory device.

Taking for example the 3DVG architecture mentioned above, FIGS. 2-5, 6A, 6B, 7, 8, 9A, 9B, 10 and 11 illustrate stages in the manufacturing process used to form conductors having vertical pillars and horizontal lines, as word lines in a 3D memory structure. FIG. 2 shows a result of forming a plurality of spaced apart stacks 210, 212 of active strips. This structure can be formed on a substrate 200, such as an integrated circuit substrate. An insulating layer 111 can be formed over an area of the substrate 200 on which the memory array is to be formed. Alternating stacks of insulator layers and active layers can be deposited over the insulating layer 111. Then, a hard mask 206 is deposited and patterned to define the pattern of lines for the stacks. Then, the stack of insulator layers and active layers are etched using the hard mask to define a plurality of spaced apart stacks 210, 212 of insulating strips 204 and active strips 205. The insulating strips 204 can be made for example of silicon oxide, silicon nitride or other insulating materials. The active strips 205 can be made of a semiconductor material, such as polycrystalline silicon or single crystal silicon. The semiconductor material can be undoped or "intrinsic material." In other embodiments, the semiconductor material may be doped to achieve selected certain functional characteristics for the active strips.

Figure 3:
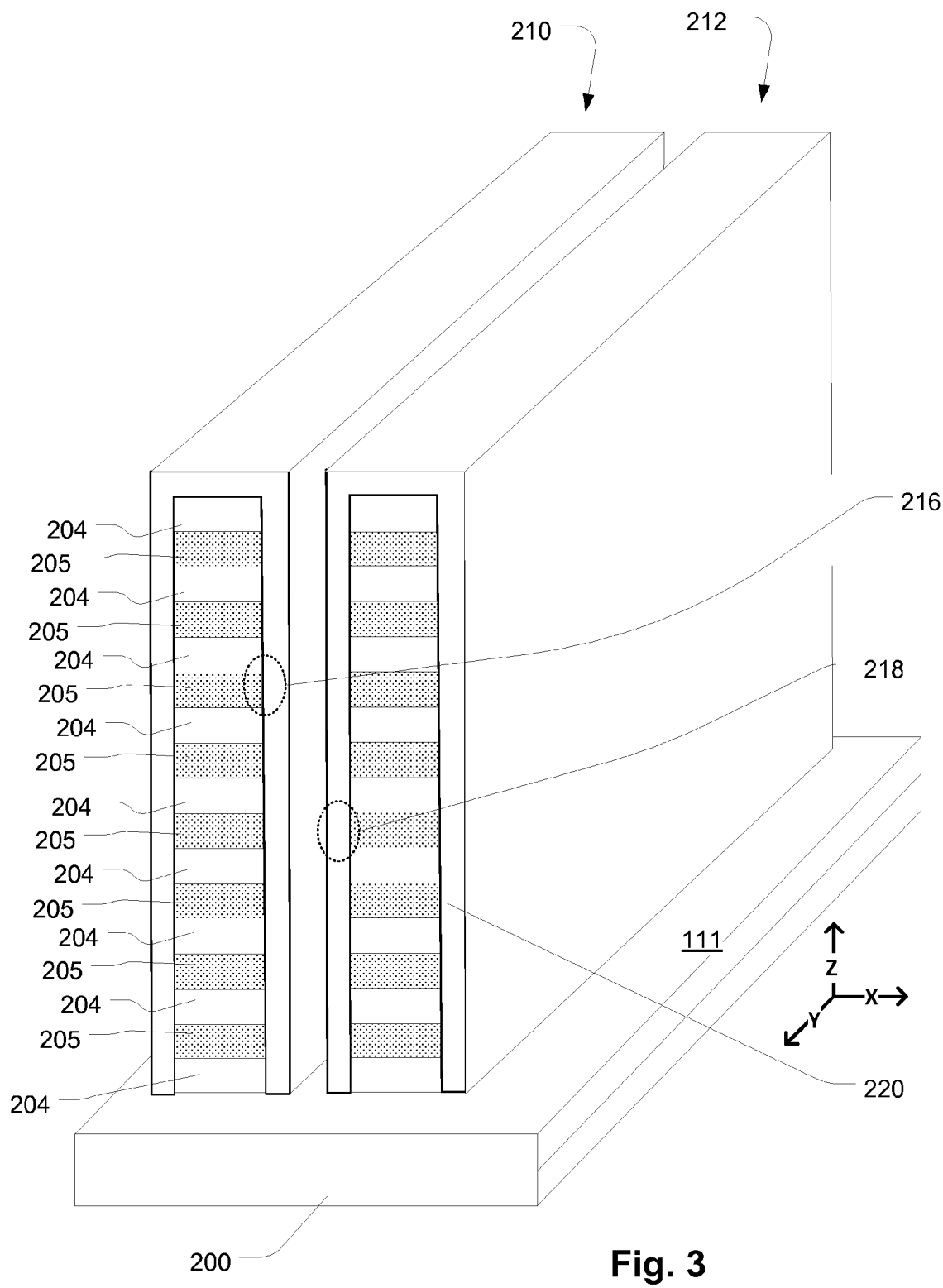

FIG. 3 shows the structure at a subsequent stage in the manufacturing process. In the process, the hard mask 206 is removed. Then, a layer of memory material 220, such as a dielectric charge trapping structure or another memory structure as described above, is formed over the plurality of spaced apart stacks, leaving a layer of memory material at least on the sidewalls (e.g. in the regions 216, 218) of the active strips 205.

Figure 4:
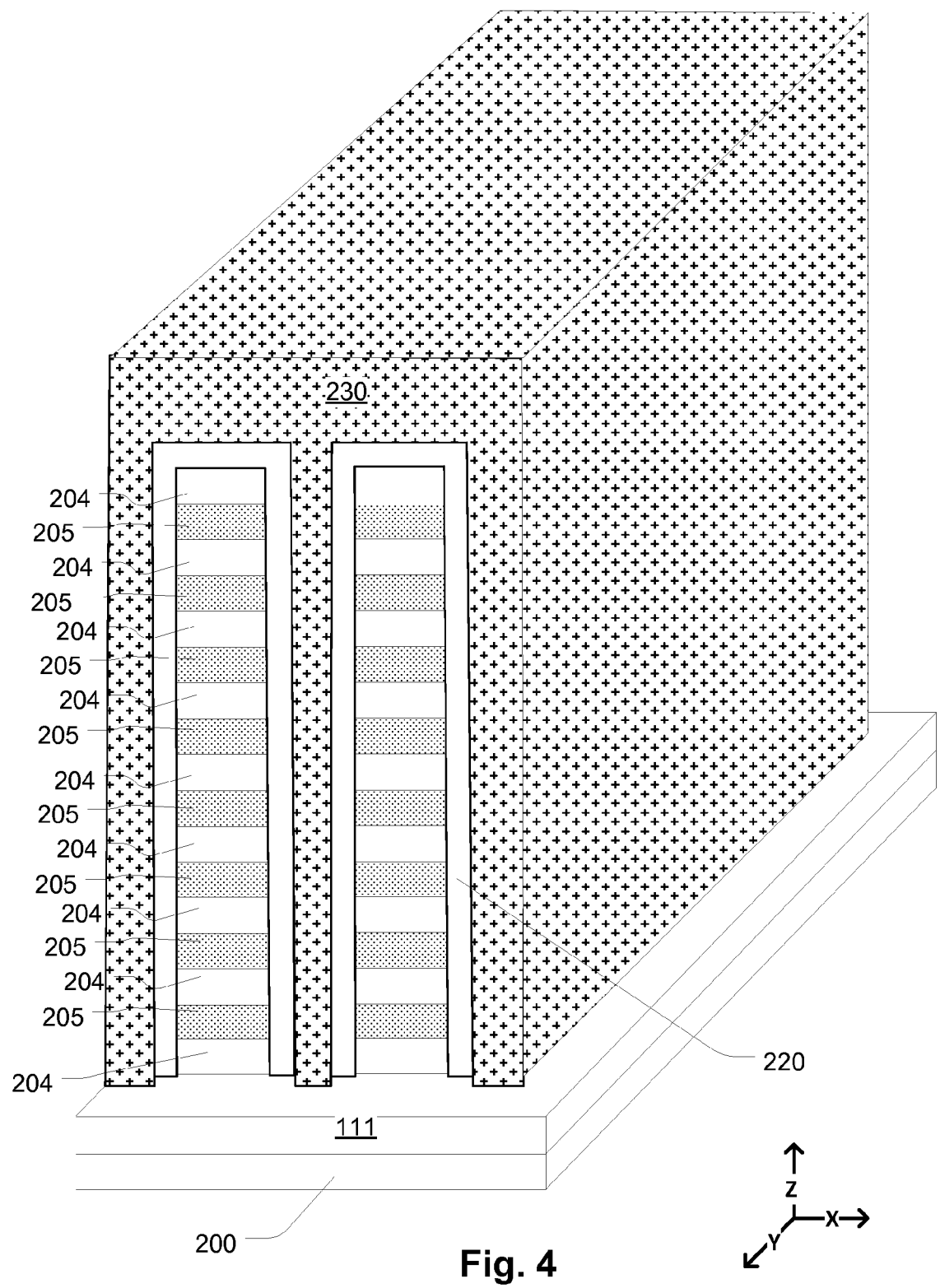

FIG. 4 illustrates the structure after deposition of a conductor material 230 providing a body of conductor material over the plurality of spaced apart stacks 210, 212 from which conductors having a plurality of vertical extensions as described herein can be implemented. The conductor material 230 can be a doped polysilicon for use in formation of word lines for the 3DVG architecture. Alternatively, the conductor material can be comprised of a metal, another semiconductor material, or combinations of materials that are suitable for use as conductors chosen for compatibility with the type of memory material 220, for conductivity, and for other manufacturing parameters. In a 3DVG structure, the conductor material 230 can be advantageously a p+ doped polysilicon material, and the spaced apart stacks 210, 212 can comprise stacks of oxide and polysilicon strips (OP stacks).

Figure 5:
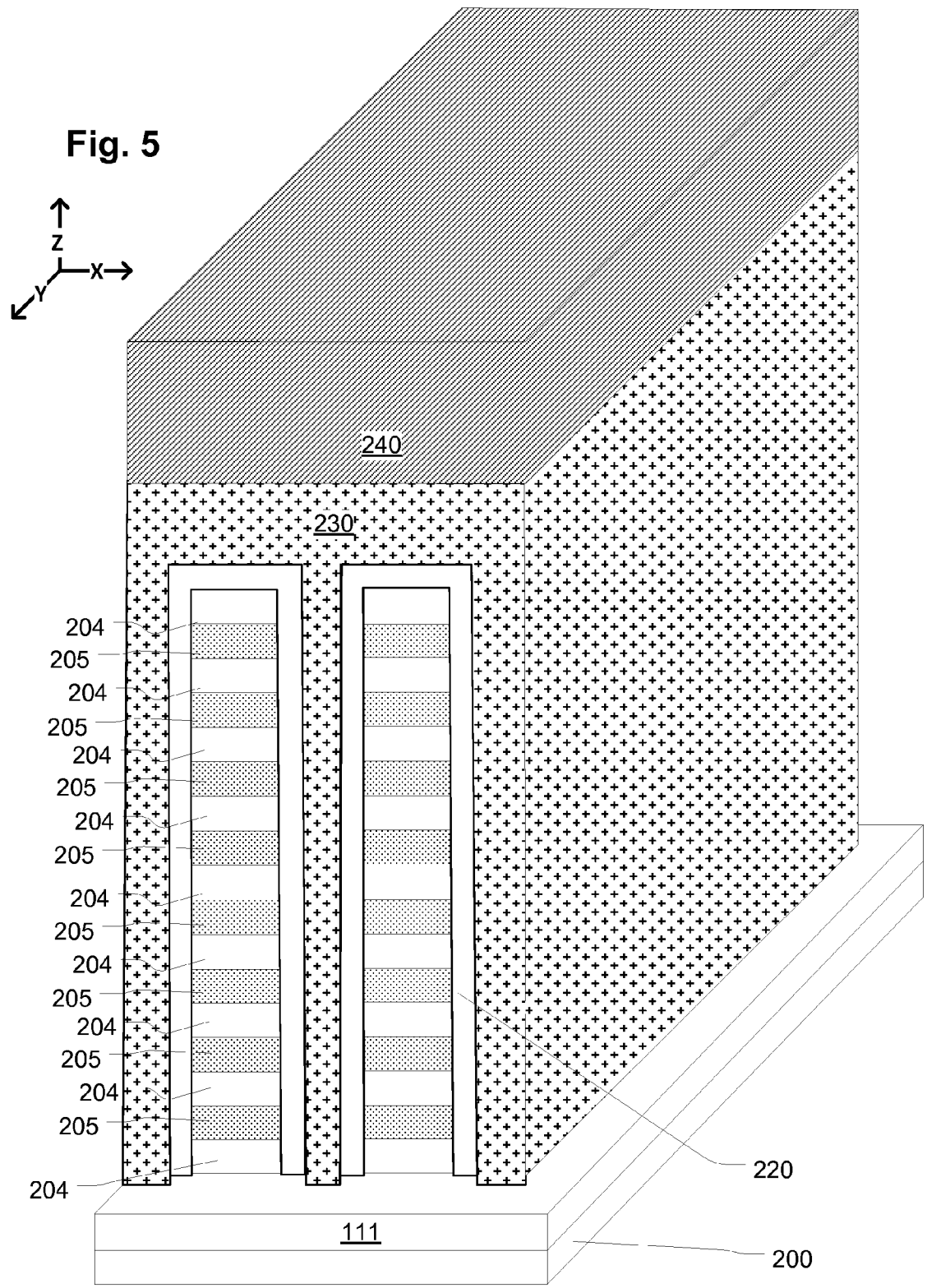

FIG. 5 illustrates the structure after depositing a layer of hard mask material 240 over the body of conductor material 230 which overlies the plurality of OP stacks. The hard mask material 240 can be a thick sacrificial carbon hard mask film. A carbon hard mask film can be composed of C—C or C—H bonding having a thickness for example of about 1000 nanometers. A dielectric film (not shown) such as a 100 nanometer thick silicon dioxide or other dielectric, can be formed over the carbon hard mask film and utilized as a mask for creating a pattern in the hard mask material 240.

Figure 6A:
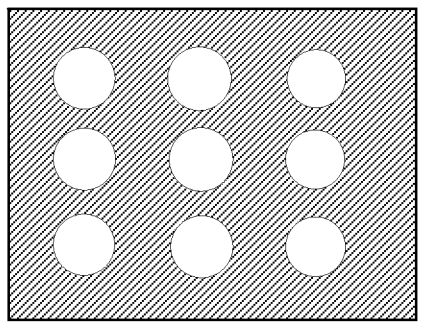

FIG. 6A illustrates a first etch mask defining a pattern of holes to be etched in the body of conductor material 230. The holes are positioned between the stacks of active layers and used to remove material from the body of conductor material 230 between the stacks. The hole pattern can be created using a photoresist and photo exposure using immersion 193 nm lithography tools, over the dielectric film mentioned above overlying the carbon hard mask film. The photoresist pattern is then transferred onto the dielectric film by etching. The dielectric film will serve as the hard mask for opening the sacrificial carbon hard mask, and the sacrificial carbon hard mask will be used to open the holes in the body of conductor material 230 both in the region above the stack surfaces and in the spaces between the spaced apart stacks.

Figure 6B:
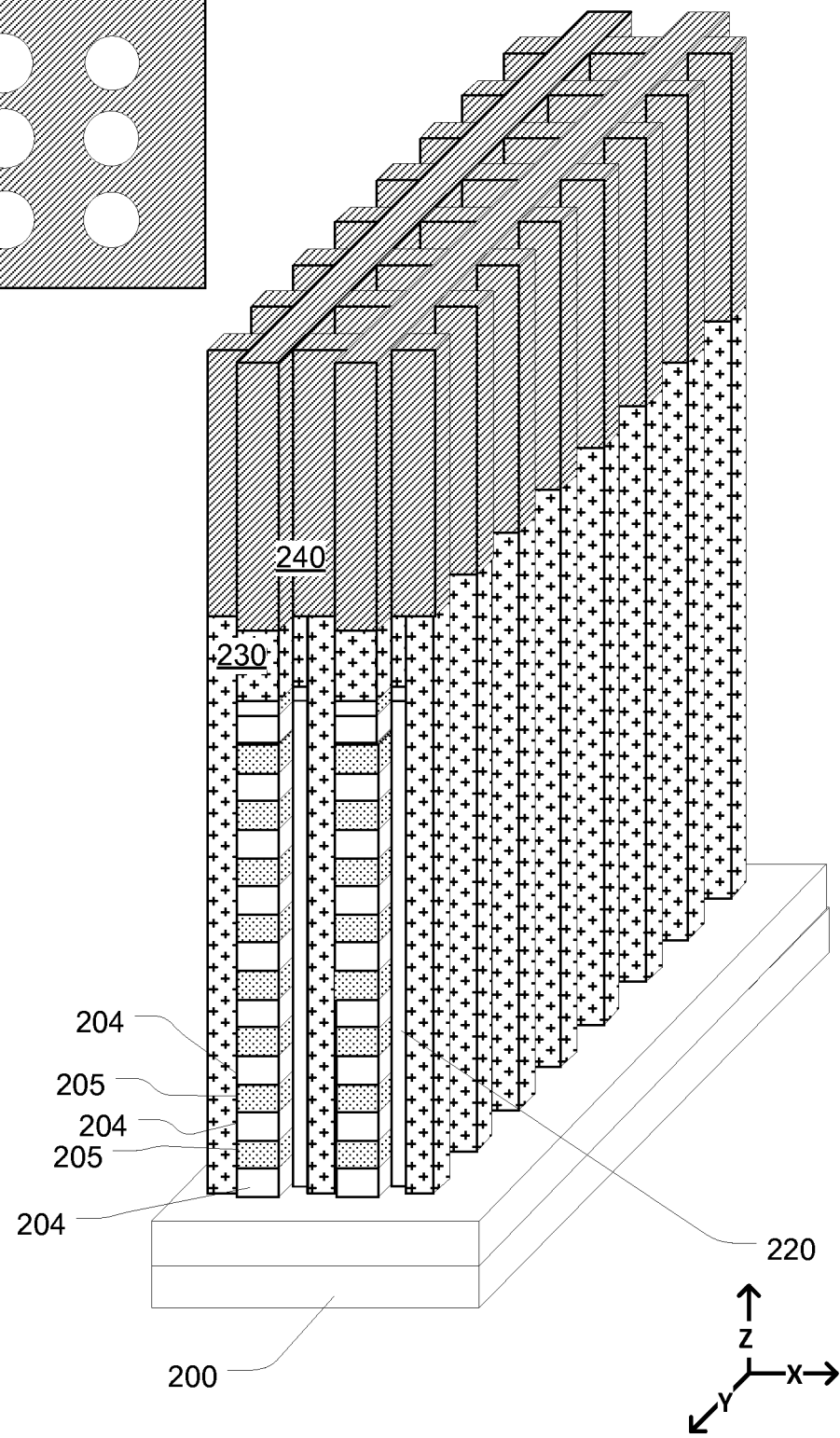

FIG. 6B illustrates the structure after etching holes through the hard mask material 240 and the body of conductor material 230 using the pattern shown in FIG. 6A. The holes are represented as rectangular shapes in FIG. 6B to simplify the drawing. Of course the holes will have the shape that is determined by the mask and etching process.

Etching the body of conductor material 230 (in this case, polysilicon) to form hole structures in the spaces between the stacks, results in pillars in the conductor material remaining in the space between the stacks. The etching can be done using a plasma etch recipe, which has equal etching rate (or close to equal) for the memory material, such as the silicon oxide and silicon nitride of the dielectric charge trapping structure in this example, and for conductor material (polysilicon in this example). This can be done for example by using the combination of $NF_3$, $CH_2F_2$, HBr, $O_2$, $CH_4$, and He.

After hole etching through the conductor material between the OP stacks, there should be some remaining portions of the hard mask material 240 as illustrated (not to scale). Also all or part of the memory material (220) along the sides of the holes (in the region along the active strips between the memory cells to be formed) can be removed during this etch process.

Figure 7:
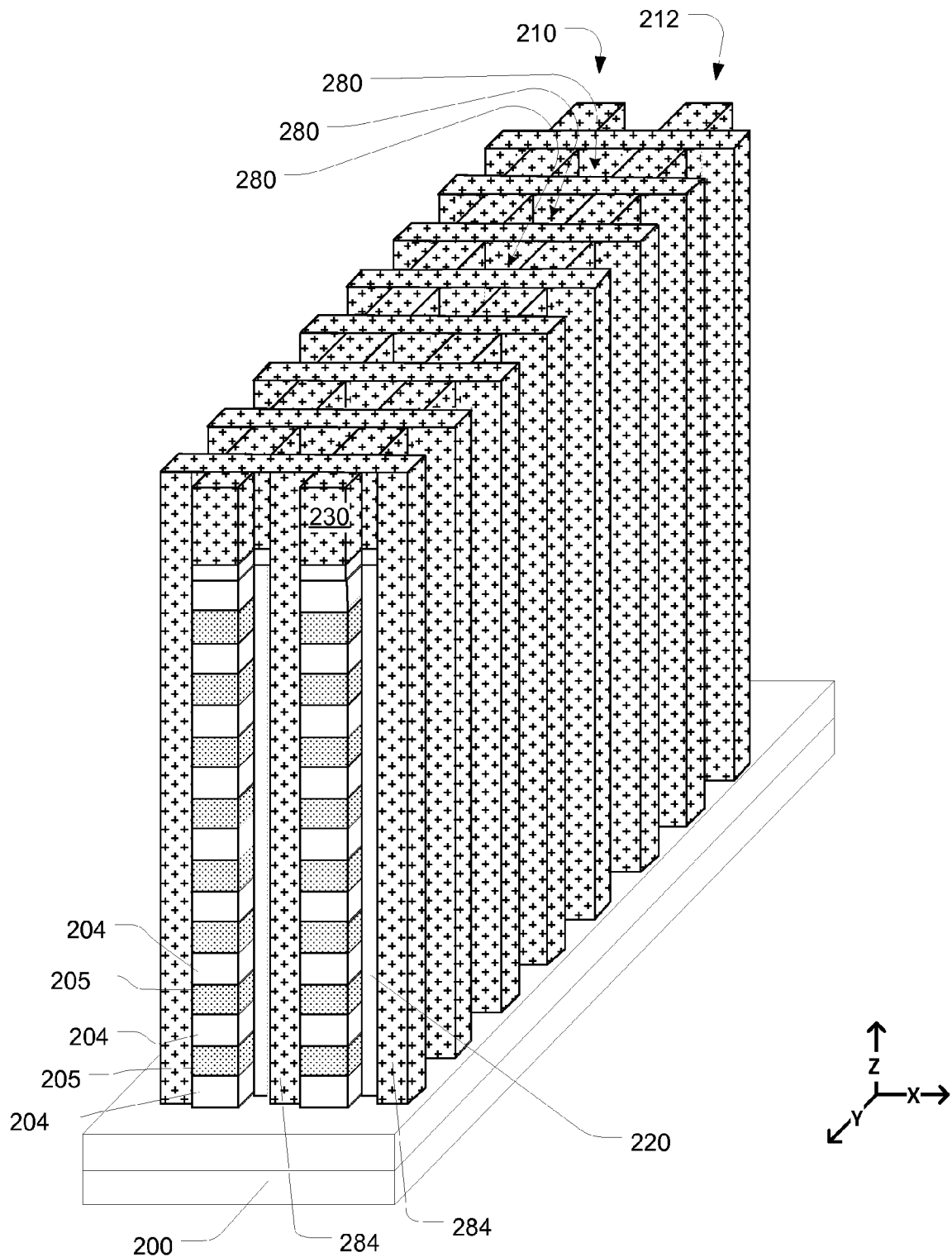

FIG. 7 illustrates the structure after removal of the hard mask material 240. The portions of the carbon hard mask remaining after the hole etch can be stripped away by an ashing process using oxygen plasma, or by $H_2SO_4$, or both. As a result of the hole etching, a pattern of holes 280 is created in the body of conductor material 230. Also, vertical extensions or pillars 284 in the conductor material are established in the spaces between the spaced apart stacks 210, 212 of active layers.

Figure 8:
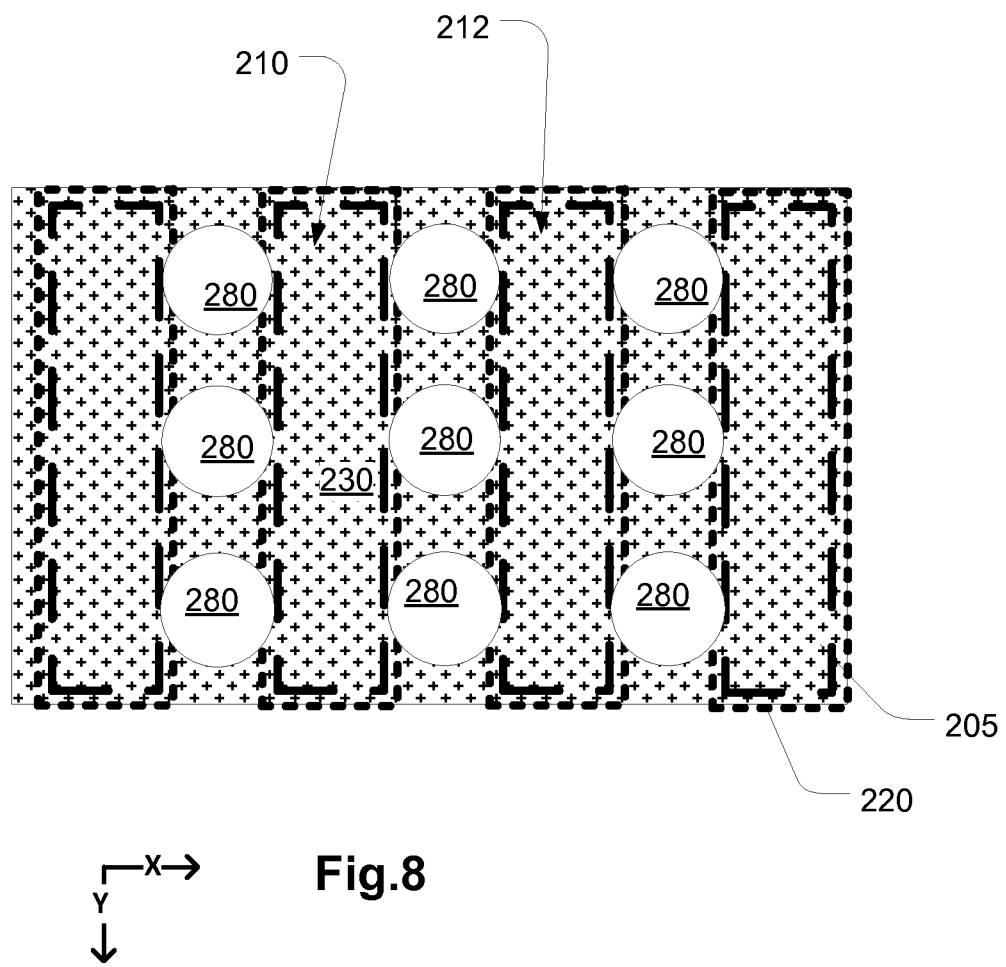

FIG. 8 is a top view of the structure of FIG. 7, showing a pattern of holes 280 through the body of conductor material 230. Underlying the body of conductor material, as shown by bold dashed outlines, are the stacks of active strips (205), which are covered by layers of memory material 220. The holes 280 lie in the spaces between the stacks 210, 212. Also the conductor material 230 between the stacks is separated into many pillar structures (284 in FIG. 7). The conductor material 230 above the stacks remains, and links all of the pillar structures together, appearing as a sheet with many holes as shown in FIG. 8.

After the hole etching, another etching process is required to isolate the word lines into a plurality of separated horizontal lines with vertical extensions in the spaces between the stacks. When separated, the conductor acts as the vertical gate/word line structures for the 3DVG architecture in this example.

The second etch process can include forming a flat surface on the structure of FIG. 8 by filling the holes with the dielectric material (for example silicon dioxide or other insulator) and planarizing the structure while leaving a layer (not shown) of the insulating material over the top of the conductor material 230. Then, a hard mask layer 285, such as a carbon hard mask is described above, can be deposited over the insulating material and conductor material 230. Alternatively, a flowable hard mask can be utilized to seal the holes for the purposes of the second etch processing, without requiring necessarily formation of an insulating fill at this stage.

Figures 9A, 9B:
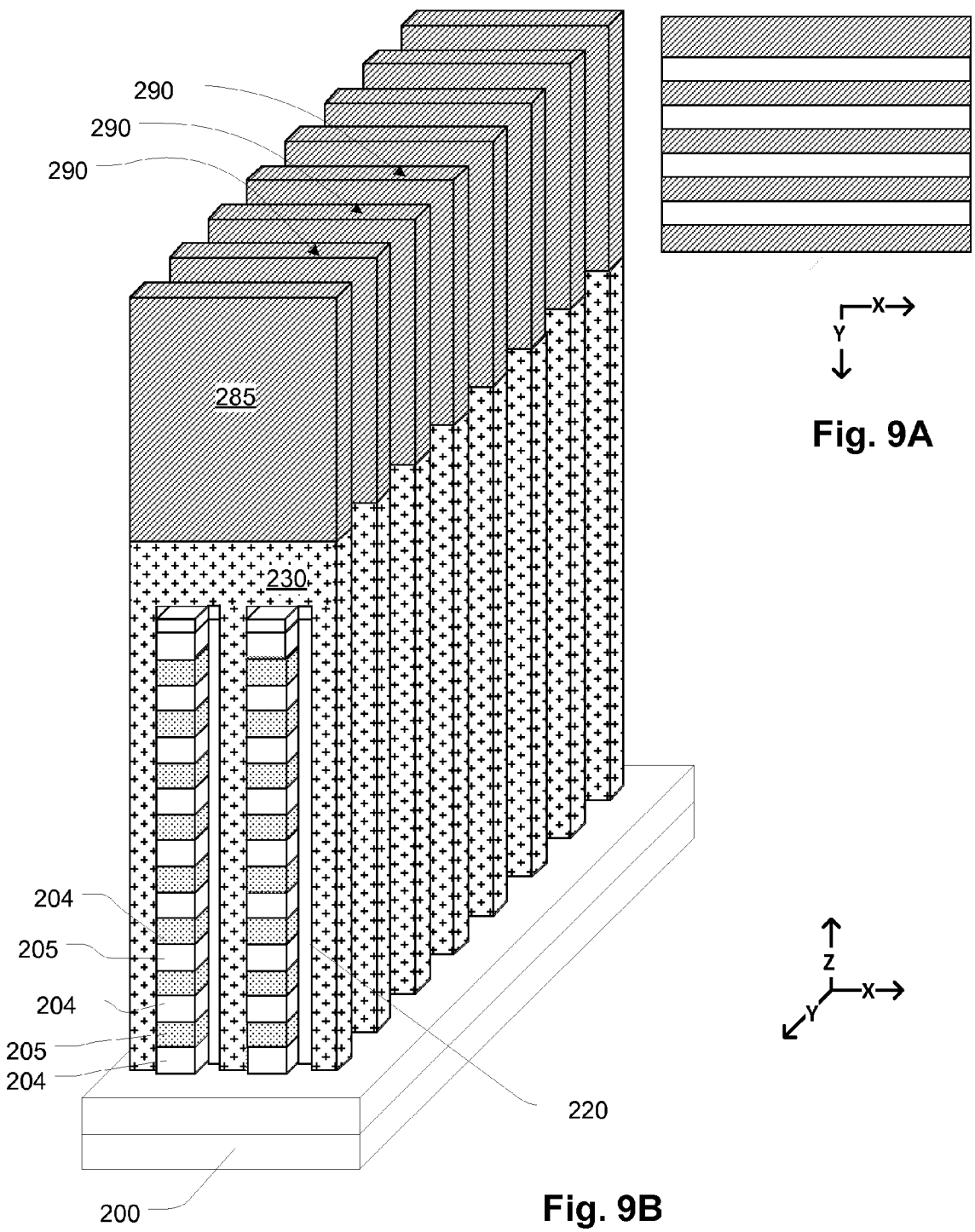

Another layer of dielectric can be deposited over the hard mask layer, and then a lithography tool can be used to pattern photoresist to define a plurality of horizontal lines as shown in FIG. 9A. The photoresist can be used to transfer the pattern into the layer of dielectric over the hard mask, and then the layer of dielectric can be used to transfer the pattern into the hard mask.

As a result, the structure shown in FIG. 9B is formed having lines 290 of hard mask material overlying the body of conductor material 230. An etch process can be used that is selective for the conductor material, and stops on the dielectric material on the top surface of the stacks to define the line patterns in conductor material 230.

Figure 10:
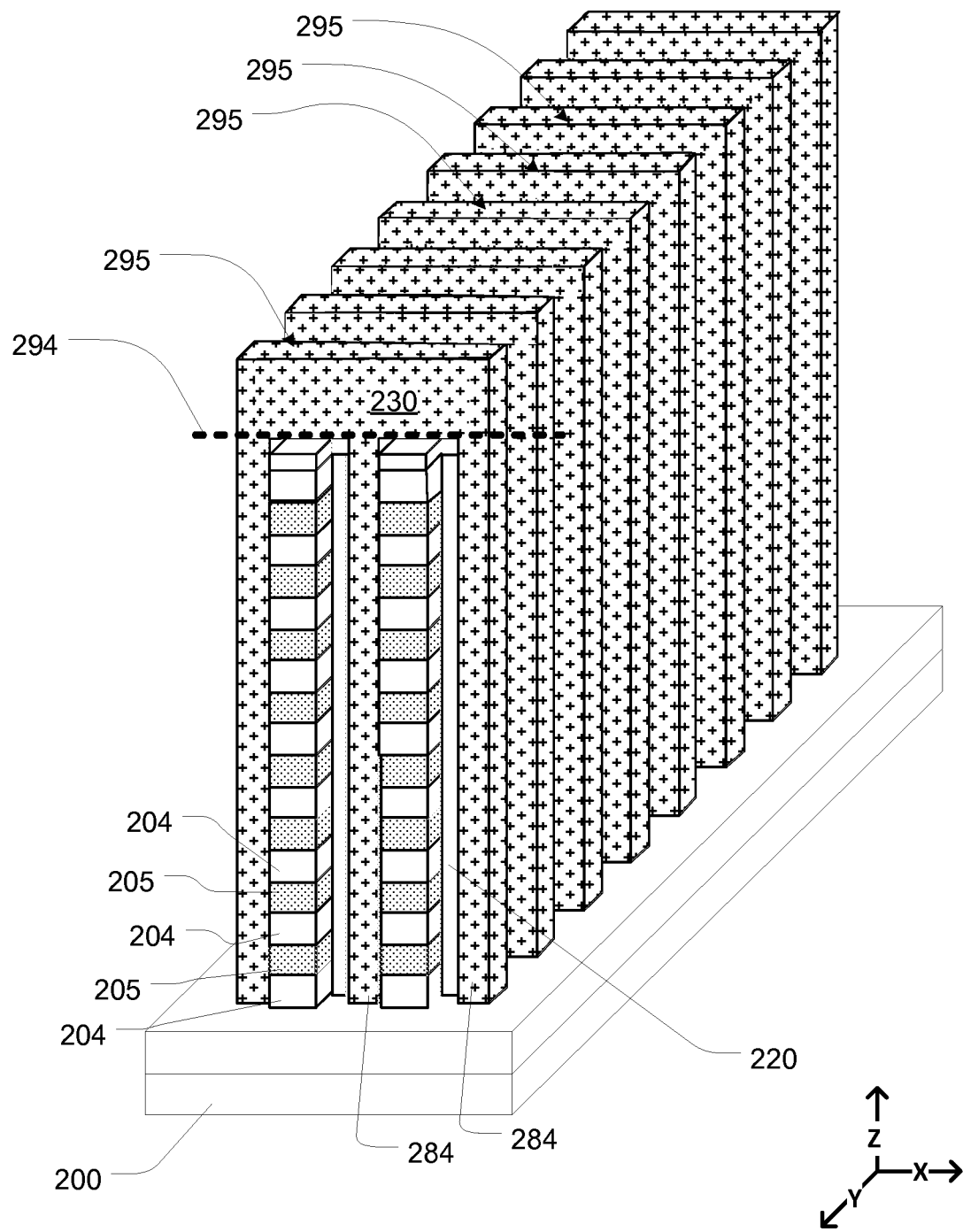

FIG. 10 illustrates the structure after removal of the hard mask 285. The body of conductor material 230 has been etched twice to define horizontal lines 295 which overlie the plurality of spaced apart stacks above the line 294, and vertical pillars 284 which extend in the spaces between the top surfaces below the line 294 of the plurality of spaced apart stacks.

Figure 11:
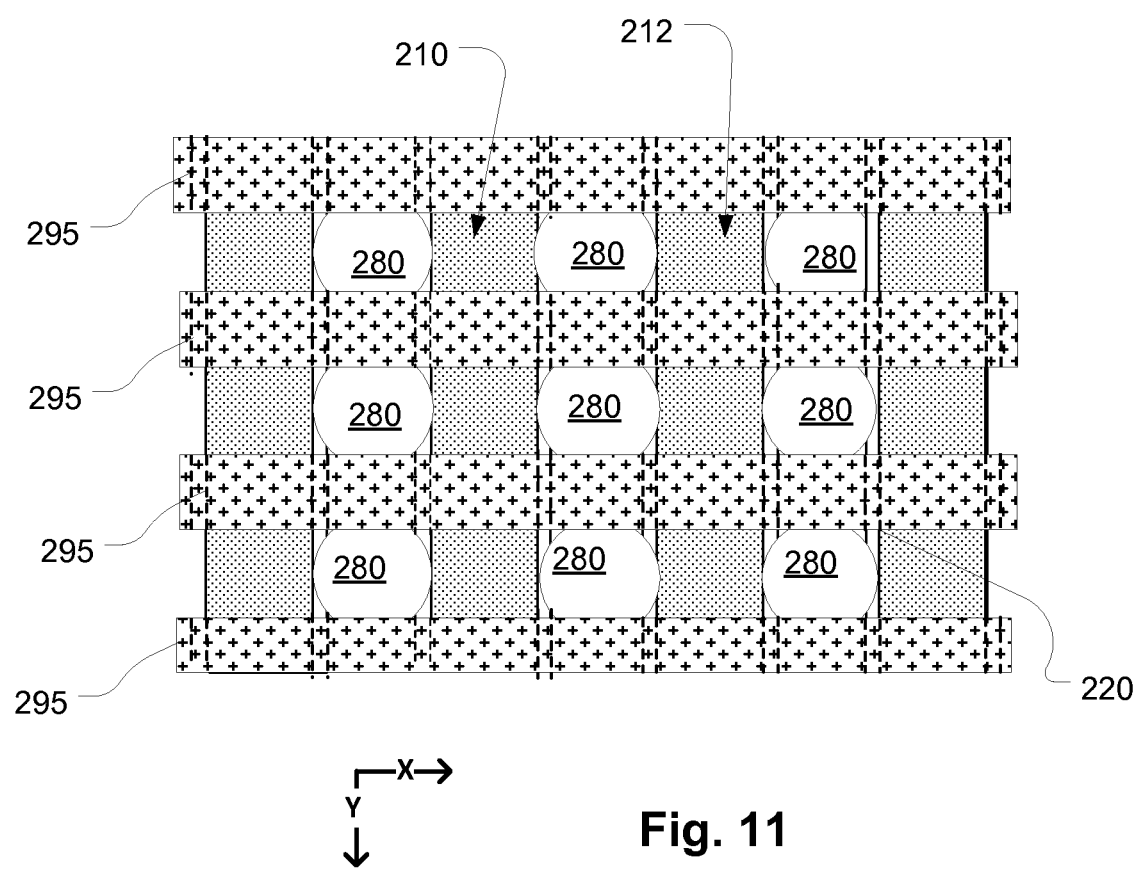

FIG. 11 shows a plan view from the top of the structure shown in FIG. 10. Horizontal lines 295 that result from the line-type etching overlay the spaced apart stacks 210, 212 of active materials. The holes 280 in the spaces between the spaced apart stacks 210, 212, and between the horizontal lines 295 serve to isolate the vertical extensions from one another between the stacks. The memory material 220 (illustrated in the corners of the holes 280 in this example) may be removed from the sidewalls of the stacks inside the holes 280, remaining only between the vertical extensions of the conductor material and the sidewalls of active strips in the stacks 210, 212.

From the top view, the line-type etching defines the width of the word lines in the 3DVG structure above the stacks 210, 212 of active material. The width of the word lines is important for word line signal propagation across the array. The hole-type etch defines the device channel length, which affects the threshold voltage $V_T$ windows and other memory cell parameters, that are important for memory cell operation.

Because the line-type etching and the hole-type etching are made using separate masks, there is some misalignment tolerance for the line-type etching. As long as the lines can connect the pillars below them, then the structure will perform satisfactorily. During the hole-type etching, misalignment of the mask that defines the array of holes, can be compensated for by the layer of memory material, such as the oxide and nitride films used in a dielectric charge trapping structure, providing significant alignment tolerance.

For a 3DVG example, assume the active strip (polysilicon channel bit line) pitch is Z nanometers (parallel to the word line direction), the horizontal polysilicon channel space is X nanometers, where in some embodiments (X<Z), and the stacks of active strips have a profile forming an angle >89.5 degrees, preferably close to 90 degrees, with a plane defined by the underlying insulating layer 111. The dielectric charge trapping layer, such as BE-SONOS film, can be about 20 nanometers thick, covering the two sides of the space between the stacks, narrowing the space to (X−20*2) nanometers. The remaining space between the stacks will be filled with the conductor material (polysilicon or metal). The conductor material also sits on top of the stacks. The hole pattern should have the same pitch as the active strips of Z nanometers and the hole diameter is defined as Y nanometers, and the angle of the hole profile is >89.5 degrees, preferably to 90 degrees. The hole diameter Y should be larger than (X−20*2) but smaller than Z (Y<Z). If the alignment is perfect, the hole (Y nanometers) is wide enough to remove the conductor material and the memory material on the sidewalls of the active strips between the two sides of the vertical pillars of conductor material. Even if the overlay is shifted by 20 nanometers in this example, the conductor material can be effectively separated. Therefore, the 20 nanometer dielectric charge trapping film provides tolerance of misalignment of the hole pattern mask.

As long as pillar structures can be linked to the top line structure, and each pillar does not short to the neighboring pillars in the same trench, with enough space to sustain an E-field for the purposes of context, of >5MV/cm for example, between the adjacent pillar in the same trench, then conductors can operate as word lines for 3DVG structures.

Figure 12:
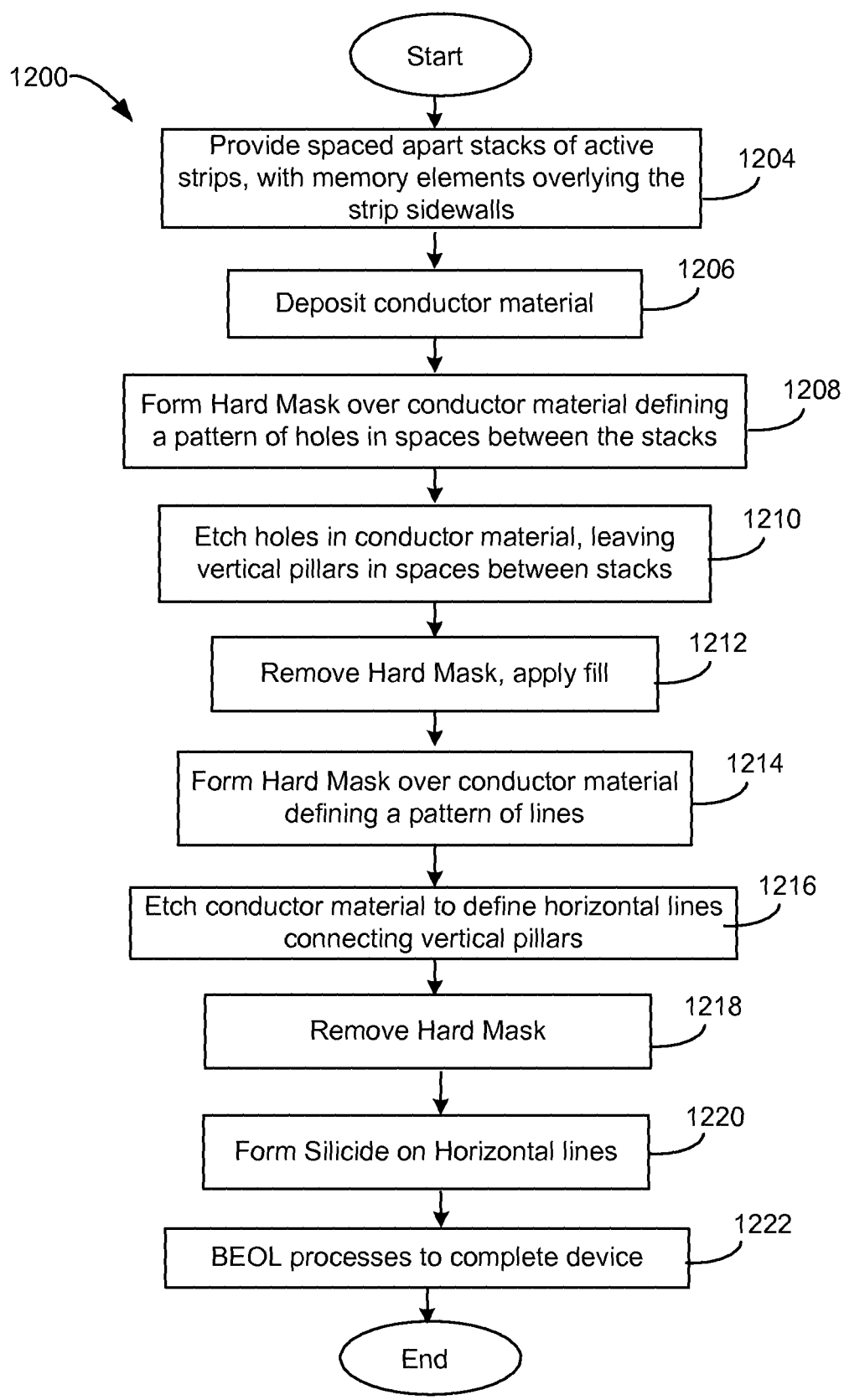
FIG. 12 is a process flow diagram for forming a conductor structure for a 3D memory device.

FIG. 12 is a simplified process flow 1200 for an example of a method of forming a conductor structure, for example a gate structure for a 3D memory device.

The process steps shown in FIG. 12 begin at the stage shown in FIG. 3 for example, with providing spaced apart stacks of active strips with memory elements overlying the sidewalls of the strips (1204). Then, a body of conductor material is deposited over the spaced apart stacks, and filling the trenches between the stacks (1206). The body of conductor material is subjected to two etch processes in this example. The first etch processing includes forming a first hard mask over the conductor material defining a pattern of holes in the spaces between the stacks (1208). Then, the holes are etched in the conductor material, leaving vertical pillars in the spaces between the stacks (1210). The first etch process is completed by removing hard mask material, and optionally applying a fill material to prepare for the following etch (1212).

The second etch process includes forming a second hard mask over the conductor material, defining a pattern of lines (1214). Then, the conductor material is etched to form trenches over the stack and aligned with the holes in order to define horizontal lines arranged orthogonally to the stacks, connecting rows of vertical pillars that extend into spaces between the stacks, and overlying the spaced apart stacks (1216). The horizontal lines can extend to decoding circuitry or other peripheral circuitry on the device needed to control operation the array. Next, the hard mask used for etching the pattern of lines is removed (1218). Optionally, a layer of silicide can be formed on the horizontal lines, or other processing can be executed to improve the conductivity of the horizontal lines (1220). Finally, back end of line (BEOL) processes are executed in order to complete the device (1222). In this example, the hole etch (1208, 1210) is performed first, followed by the line etch (1214, 1216). In other embodiments, the line etch can be performed first, followed by the hole etch.

A process is described which results in conductors having a plurality of vertical extensions, which are arranged as pillars in trenches between stacks of active strips. The conductors with vertical extensions are suitable for use as word lines in 3DVG architectures, and as bit lines in vertical bit line memory devices. Also, the conductors with vertical extensions can be utilized in other environments requiring deep extensions of conductive lines in high aspect ratio trenches.

The above sequence of steps provides a method for forming a plurality of high aspect ratio conductor structures having vertical extensions (for example, gate structures) for a high density 3D memory device having a plurality of spaced-apart stacks of active layers. As a result of the two-step etching of a single body of conductor material, the vertical pillars have first and second sides in corresponding spaces between the spaced-apart stacks having a first etch profile that arises from the first etch, and the horizontal lines have first and second sides over the vertical pillars to which they are connected, and have a second etch profile that arises from the second etch, and that in some embodiments will be different than the first etch profile and characteristic of conductors having vertical extensions made as described herein.

Figure 13:
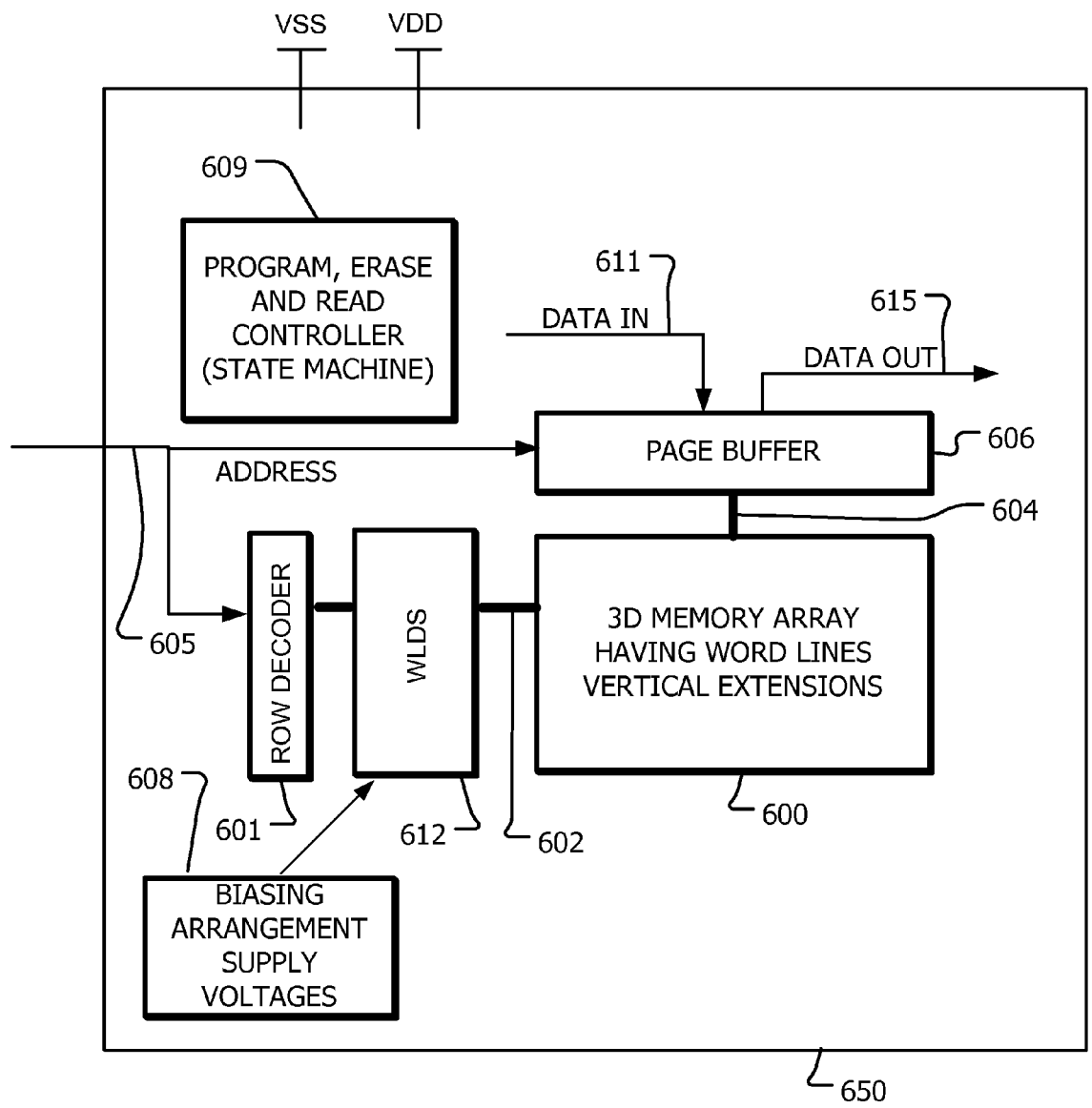
FIG. 13 is a block diagram of an integrated circuit including a 3D memory array having horizontal conductors with a plurality of vertical extensions arranged as word lines.

FIG. 13 is a block diagram of an integrated circuit including a 3D memory array having horizontal conductors with a plurality of vertical extensions arranged as word lines, and made using a process as described herein. A row decoder 601 is coupled to, and in electrical communication with, word line drivers in block 612, which drive word lines 602 which have vertical extensions in trenches between stacks of active strips, and horizontal lines arranged along rows in the memory array 600. The word lines include vertical pillars having first and second sides in corresponding spaces between the spaced-apart stacks having a first etch profile, and include horizontal lines having first and second sides over the vertical pillars to which they are connected, and having a second etch profile different than the first etch profile.

A page buffer 606 is coupled to and in electrical communication with a plurality of bit lines 604 arranged along columns in the memory array 600 for reading data from, and writing data to, the memory cells in the memory array 600. Addresses are supplied on bus 605 to the row decoder 601 and to the page buffer 606. Data is supplied via the data-in line 611 from input/output ports on the integrated circuit 650, to the page buffer 606. Data is supplied via the data-out line 615 from the page buffer 606 to input/output ports on the integrated circuit 650, or to other data destinations internal or external to the integrated circuit 650. A state machine, clock circuitry and other control logic are in circuitry 609. Biasing arrangement supply voltages are generated in block 608, using charge pumps and other voltage sources, and are supplied to the word line drivers in block 612, and to other circuitry on the integrated circuit. The integrated circuit 650 includes terminals used to connect to a power supply, which provides the supply voltage VDD and VSS to the chip. In embodiments described herein, the supply voltage VDD can be a low voltage, such as about 1.8 Volts.

In general, an etching process for the conductive lines having vertical extensions in trenches between ridge-shaped structures, such as for word lines over stacks of active bit line strips in a 3DVG architecture, is separated into two steps.

The first etching step is to separate a body of conductor material overlying the trenches into many pillars below a top surface of the ridge-shaped structures. The second etching step is to cut the body of conductor material above the top surface of the ridge-shaped structures into many lines. In a word line structure, each line connects to many pillars, and each pillar only connects to one line. The many pillars are separate below the top surface of the ridge-shaped structures.

The etching process can also have two steps as follows. The first etching step is to form holes in the body of conductor material between the stacks, in the regions to be between the word lines. The second etching step is to cut the body of conductor material into lines that form the word lines for the 3DVG architecture. The holes in the conductor material prevent bridging between the word lines.

While the present invention is disclosed by reference to the preferred embodiments and examples detailed above, it is to be understood that these examples are intended in an illustrative rather than in limiting sense. It is contemplated that modifications and combinations will readily occur to those skilled in the art, which modifications and combinations will be within the spirit of the invention and the scope of the following claims.

The invention claimed is:

1. A method of forming conductors in a 3D circuit, comprising:
providing a substrate having a plurality of spaced-apart stacks;
forming a body of conductor material by depositing a conductor material over the plurality of spaced-apart stacks;
etching the body of conductor material to form a pattern of vertical holes between the spaced-apart stacks in the body of conductor material and forming a pattern of vertical pillars between stacks in the plurality of spaced-apart stacks; and
etching the body of conductor material to form trenches over the spaced-apart stacks, the trenches aligned to connect vertical holes in the pattern of vertical holes, and forming a pattern of horizontal lines in the body of conductor material over stacks in the plurality of spaced-apart stacks, the horizontal lines connecting vertical pillars in the pattern of vertical pillars.

2. The method of claim 1, including using a first etch mask comprising a hard mask material to form the pattern of vertical pillars.

3. The method of claim 2, including using a second etch mask comprising a hard mask material to form the pattern of horizontal lines.

4. The method of claim 1, including filling the vertical holes, before the etching to form the trenches.

5. The method of claim 1, including using a first etch mask comprising a hard mask material in a first etch process to form the pattern of vertical holes in the body of conductor material, removing the first etch mask, and filling the vertical holes, and then using a second etch mask in a second etch process to form the trenches in the body of conductor material, to divide the body of conductor material into the vertical pillars and horizontal lines.

6. The method of claim 1, wherein the spaced-apart stacks comprise stacks of active layers, including forming a layer of memory material on side walls of the active layers in the spaced-apart stacks before said depositing the conductor material.

7. The method of claim 1, wherein the pattern of vertical pillars includes an array of columns and rows, and the pattern of horizontal lines connects vertical pillars in rows of the array.

8. The method of claim 7, wherein a row of vertical pillars in the array, and a horizontal line in the pattern connected to the row comprise a word line.

9. A semiconductor device manufactured according to the method of claim 1.

10. A method of forming 3D memory, comprising:
forming a plurality of layers of active material separated by insulating material;
etching the plurality of layers to form a plurality of spaced-apart stacks that include strips of active material;
forming a layer of memory material on sidewalls of the active strips in the spaced-apart stacks;
depositing a body of conductor material over the layer of memory material and over the plurality of spaced-apart stacks;
etching the body of conductor material to form a pattern of vertical holes between the spaced-apart stacks in the body of conductor material and forming a pattern of vertical pillars from the body of conductor material over the layer of memory material and between stacks in the plurality of spaced-apart stacks, whereby memory cells are disposed at cross-points of the active strips and the vertical pillars; and
etching the body of conductor material to form trenches over the spaced-apart stacks, the trenches aligned to connect vertical holes in the pattern of vertical holes, and forming a pattern of horizontal lines in the body of conductor material over stacks in the plurality of spaced-apart stacks, the horizontal lines connecting vertical pillars in the pattern of vertical pillars.

11. The method of claim 10, including:
etching the body of conductor material using a hole etch process, to form the pattern of vertical holes; and
etching the body of conductor material using a line etch process, to form the trenches over the spaced apart stacks aligned to connect vertical holes in the patter of vertical holes, whereby portions of the body of conductive material remaining comprise the vertical pillars and horizontal lines.

12. The method of claim 10, including using a first etch mask comprising a hard mask material to form the pattern of vertical pillars.

13. The method of claim 12, including using a second etch mask comprising a hard mask material to form the pattern of horizontal lines.

14. The method of claim 10, including using a first etch mask comprising a hard mask material in a first etch process to form the pattern of vertical pillars, removing the first etch mask, and filling between the vertical pillars, and then using a second etch mask in a second etch process to form the pattern of horizontal lines.

15. A semiconductor device manufactured according to the method of claim 10.

* * * * *